(12) United States Patent
Sherman et al.

(10) Patent No.: US 11,362,448 B2
(45) Date of Patent: Jun. 14, 2022

(54) CONNECTOR HAVING LATCHING PINS THAT CHANGE ANGLE FOR MOUNTING TO A CIRCUIT BOARD

(71) Applicant: Tag-Connect, LLC, Burlingame, CA (US)

(72) Inventors: Neil Stanley Sherman, San Bruno, CA (US); Ryan R. Hopkins, Reno, NV (US)

(73) Assignee: Tag-Connect, LLC, Burlingame, CA (US)

( * ) Notice: Subject to any disclaimer, the term of this patent is extended or adjusted under 35 U.S.C. 154(b) by 53 days.

(21) Appl. No.: 16/995,628

(22) Filed: Aug. 17, 2020

(65) Prior Publication Data

US 2021/0376505 A1 Dec. 2, 2021

Related U.S. Application Data

(60) Provisional application No. 63/033,132, filed on Jun. 1, 2020.

(51) Int. Cl.
*H01R 12/00* (2006.01)
*H01R 12/71* (2011.01)
(Continued)

(52) U.S. Cl.
CPC ......... *H01R 12/714* (2013.01); *H01R 12/75* (2013.01); *H01R 13/2407* (2013.01); *H01R 13/629* (2013.01)

(58) Field of Classification Search
CPC .. H01R 12/714; H01R 12/75; H01R 13/2407; H01R 13/629; H01R 13/639;
(Continued)

(56) References Cited

U.S. PATENT DOCUMENTS 2,858,515 A 10/1958 Thunander et al.
3,329,926 A 7/1967 Aksu et al.
(Continued)

FOREIGN PATENT DOCUMENTS

EP 0346206 A1 12/1989
EP 2473013 A1 7/2002
WO WO2018/165538 A1 9/2018

OTHER PUBLICATIONS

Extended European Search Report dated Oct. 27, 2021, European Patent Application No. 21172150.1-1201.
(Continued)

*Primary Examiner* — Abdullah A Riyami
*Assistant Examiner* — Nelson R. Burgos-Guntin
(74) *Attorney, Agent, or Firm* — Vierra Magen Marcus LLP

(57) ABSTRACT

Described herein are connector components for selectively connecting to a PCB or other type of secondary device. Such a connector component comprises a body, electrically conductive contact pins, and latching pins. The body includes opposing sides at which are located pinch tabs. The electrically conductive contact pins and the latching pins each includes a portion thereof also extending from the bottom of the body. The pinch tabs are configured to normally bias the latching pins in a first position where the latching pins are angled relative to a central axis of the connector component when the pinch tabs are not being pinched inwards towards one another. Additionally, the pinch tabs are configured to bias the latching pins in a second position where the latching pins are substantially parallel to the central axis of the connector component when the pinch tabs are being pinched inward towards one another.

20 Claims, 7 Drawing Sheets

(51) Int. Cl.
*H01R 12/75* (2011.01)
*H01R 13/24* (2006.01)
*H01R 13/629* (2006.01)

(58) Field of Classification Search
CPC ....... H01R 12/7064; H05K 2201/0311; H05K 2201/10189; H05K 2201/10878; H05K 3/325
See application file for complete search history.

(56) References Cited

U.S. PATENT DOCUMENTS

| | | | |
|---|---|---|---|
| 3,340,440 A | 9/1967 | Minter | |
| 3,601,751 A | 8/1971 | Pauza | |
| 4,025,142 A * | 5/1977 | Huber | H01R 12/79 |
| | | | 439/470 |
| 4,072,387 A | 2/1978 | Sochor | |
| 4,895,523 A * | 1/1990 | Morrison | H01R 12/714 |
| | | | 439/493 |
| 4,948,379 A * | 8/1990 | Evans | H01R 12/79 |
| | | | 439/329 |
| 5,310,352 A * | 5/1994 | Mroczkowski | H01R 13/24 |
| | | | 439/289 |
| 5,383,095 A | 1/1995 | Korsunsky et al. | |
| 5,419,708 A | 5/1995 | Koss et al. | |
| 5,822,197 A * | 10/1998 | Thuault | H05K 7/1407 |
| | | | 361/803 |
| 5,963,045 A | 10/1999 | Zink et al. | |
| 5,971,773 A * | 10/1999 | Riddle | H01R 12/62 |
| | | | 439/493 |
| 6,024,587 A | 2/2000 | Garth | |
| 6,142,831 A | 11/2000 | Ashman et al. | |
| 6,152,742 A * | 11/2000 | Cohen | H01R 12/725 |
| | | | 439/60 |
| 6,152,754 A | 11/2000 | Gerhardt et al. | |
| 6,165,006 A * | 12/2000 | Yeh | H01R 13/6641 |
| | | | 439/490 |
| 6,595,801 B1 * | 7/2003 | Leonard | H01R 13/6485 |
| | | | 439/607.55 |
| 6,822,466 B1 * | 11/2004 | Holcombe | G01R 1/0416 |
| | | | 324/750.25 |
| 6,905,367 B2 * | 6/2005 | Crane, Jr. | H01R 13/514 |
| | | | 439/607.01 |
| 7,291,021 B2 | 11/2007 | Shirai et al. | |
| 7,563,107 B2 | 7/2009 | Liao et al. | |
| 7,740,486 B2 | 6/2010 | Watanabe | |
| 7,878,834 B2 * | 2/2011 | Sherman | H05K 3/325 |
| | | | 439/324 |
| 7,918,670 B2 * | 4/2011 | Shmatovich | H01R 13/637 |
| | | | 439/67 |
| 8,038,465 B2 * | 10/2011 | Pavlovic | H01R 12/716 |
| | | | 439/485 |
| 8,057,248 B1 * | 11/2011 | Sherman | H01R 12/714 |
| | | | 439/324 |
| 8,282,402 B2 | 10/2012 | Ngo | |
| 8,472,205 B2 | 6/2013 | Gondosch et al. | |
| 8,480,433 B2 | 7/2013 | Huang | |
| 8,692,124 B2 | 4/2014 | Clayton et al. | |
| 8,724,333 B2 | 5/2014 | Leifer | |
| 9,306,359 B2 | 4/2016 | Li et al. | |
| 9,549,483 B2 | 1/2017 | Tsuji et al. | |
| 9,585,263 B2 | 2/2017 | Matoy | |
| 9,660,376 B2 * | 5/2017 | Gao | H01R 43/048 |
| 9,812,799 B2 * | 11/2017 | Wittig | H01R 13/502 |
| 9,887,475 B2 | 2/2018 | Loy | |
| 10,535,938 B2 * | 1/2020 | Sherman | H01R 13/6273 |
| 10,946,939 B1 * | 3/2021 | Montague | B63B 32/00 |
| 11,056,809 B2 * | 7/2021 | Kim | H01R 12/7023 |
| 2005/0221632 A1 | 10/2005 | Sun et al. | |
| 2011/0028026 A1 * | 2/2011 | Lu | H01R 13/6581 |
| | | | 439/404 |
| 2011/0165792 A1 | 7/2011 | Burns | |
| 2012/0071015 A1 | 3/2012 | Debock et al. | |
| 2013/0149878 A1 | 6/2013 | Gao et al. | |
| 2014/0087569 A1 * | 3/2014 | Lee | H01R 13/6205 |
| | | | 439/39 |
| 2014/0242831 A1 | 8/2014 | Strahl et al. | |
| 2018/0123266 A1 * | 5/2018 | Endo | H01R 13/46 |
| 2018/0159289 A1 * | 6/2018 | Krupp | H01R 43/26 |
| 2020/0091669 A1 * | 3/2020 | Sundermeier | H01R 31/08 |
| 2021/0371054 A1 * | 12/2021 | Montague | H01R 13/5219 |
| 2021/0376505 A1 * | 12/2021 | Sherman | H01R 12/714 |

OTHER PUBLICATIONS

International Search Report and the Written Opinion dated May 24, 2018, in International Patent Appl. No. PCT/US2018/021721 filed Mar. 9, 2018.
English Abstract of EP Publication No. EP0346206 published Dec. 13, 1989.

* cited by examiner

CONNECTOR HAVING LATCHING PINS THAT CHANGE ANGLE FOR MOUNTING TO A CIRCUIT BOARD

PRIORITY CLAIM

The present application claims priority to U.S. Provisional Patent Application No. 63/033,132, filed Jun. 1, 2020, which is incorporated herein by reference in its entirety.

FIELD OF TECHNOLOGY

Embodiments of the present technology relate generally to connectors, and more specifically relate to connectors for mounting to a circuit board and for removably or temporarily connecting to a circuit board while maintaining a secure connection.

BACKGROUND

Any discussion of the related art throughout the specification should in no way be considered as an admission that such related art is widely known or forms part of common general knowledge in the field.

Connectors, such as electrical connectors have been in use for years and are manufactured in various different configurations. Many types of electrical connectors are designed to be soldered to a printed circuit board (PCB), wherein such a PCB can mechanically support and electrically connect electronic components using conductive tracks, pads and other features etched from one or more sheet layers of electrically conductive materials (e.g., copper) which are laminated onto and/or between sheet layers of a non-electrically conductive substrate. PCBs can be single-sided (e.g., have one copper layer), double-sided (e.g., have two copper layers, with one on each of two sides of one substrate layer), or multi-layer (e.g., outer and inner layers of copper, alternating with layers of non-electrically conductive substrates). Multi-layer PCBs allow for much higher component density, because circuit traces on the inner layers would otherwise take up surface space between components. The rise in popularity of multilayer PCBs with more than two, and especially with more than four, electrically conductive (e.g., copper) planes was concurrent with the adoption of surface mount technology. Surface-mount technology (SMT) is a technology for producing electronic circuits in which the components are mounted or placed directly onto the surface of a PCB. An electronic device so made is called a surface-mount device (SMD). Often, electrical connectors are SMDs.

Surface mounted electrical connectors are soldered to a PCB. Because of the small size of the connectors, soldering can often be a difficult and time-consuming process. In addition, there are a variety of disadvantages associated with surface mount technology. To begin, SMT is unsuitable for components that are subject to frequent mechanical stress, such as connectors that are used to interface with external devices that are frequently attached and detached. SMDs' solder connections may be damaged by potting compounds going through thermal cycling. In addition, on crowded circuit boards, the ability to accurately position and hold the connector while soldering can be increasingly difficult. Likewise, component-level repair is more difficult and requires skilled operators and more expensive tools, due to the small sizes and lead spacings of many SMDs. Another problem with soldering connectors is that the connector is secured in a relatively permanent manner and thus does not allow for easy removal of the connector. This makes it difficult to modify a circuit and/or replace failed components.

Although the use of surface mounted connectors has increased production process speed, the risk of defects has also increased due to component miniaturization and to the denser packing of boards. An SMT component is usually smaller than its through-hole counterpart because it has either smaller leads or no leads at all. It may have short pins or leads of various styles, flat contacts, a matrix of solder balls arranged in ball grid arrays (BGAs), or terminations on the body of the component. In addition, surface mounted connectors occupy valuable space on increasingly crowded boards, space which could otherwise be used for more frequently utilized components.

Other types of electrical connectors are also utilized that may allow for a connection in a manner other than through soldering. However, many of these connectors are often expensive or substantially fragile thus providing yet another inefficient manner in which to connect an electrical connector or component to a circuit board. Likewise, such connectors are typically large and bulky in relative size to the circuit board, which is typically becoming smaller and more crowded over time. Examples of removable connectors are disclosed in U.S. Pat. Nos. 7,878,834 and 8,057,248.

Because of the inherent problems with the related art, there is a need for a new and improved connector components for providing an electrical connection between devices, particularly between a device and a circuit board, in an efficient and cost-effective manner. At least some of these objectives will be met by the present technology.

SUMMARY

Certain embodiments of the present technology relate to connector components for selectively connecting to a PCB or other type of secondary device. In accordance with certain embodiments, a connector component comprises a body, electrically conductive contact pins, and latching pins. The body includes opposing sides at which are located pinch tabs. The electrically conductive contact pins each includes a portion thereof extending from a bottom of the body. Similarly, the latching pins each includes a portion thereof also extending from the bottom of the body. The pinch tabs are configured to bias one or more of the latching pins in a first position where the one or more of the latching pins is/are angled relative to a central axis of the connector component when the pinch tabs are not being pinched inwards towards one another. Additionally, the pinch tabs are configured to bias the one or more of the latching pins in a second position where the latching pins are substantially parallel to the central axis of the connector component when the pinch tabs are being pinched inward towards one another.

In accordance with certain embodiments, each of the latching pins includes an upper portion and a lower portion, the upper portion located within the body, and the lower portion extending from the bottom of the body. Each of the pinch tabs engages the upper portion of at least one of the latching pins to normally bias the at least one of the latching pins in the first position when the pinch tabs are not being pinched inwards towards one another, and to bias the at least one of the latching pins in the second position where the latching pins are substantially parallel to the central axis of the connector component when the pinch tabs are being pinched inward towards one another.

In accordance with certain embodiments, the latching pins are configured to be inserted into respective holes in the PCB while the pinch tabs are being pinched inwards towards one another to bias the one or more of the latching pins into the second position where the one or more of the latching pins is/are substantially parallel to the central axis of the connector component.

In accordance with certain embodiments, the one or more of the latching pins attempt to return to the first position, where the one or more of the latching pins are angled relative to the central axis of the connector component, after the latching pins are inserted into the respective holes in the PCB and the pinch tabs are no longer being pinched inwards towards one another, which causes at least a portion of an outer peripheral surface of each of the latching pins to apply a tangential force against at least a portion of an inner peripheral surface of a respective one of the holes in the PCB.

In accordance with certain embodiments, the electrically conductive contact pins are configured to come into contact with respective electrically conductive contact points on the PCB after the latching pins are inserted into the respective holes in the PCB.

In accordance with certain embodiments, after the latching pins have been inserted into the respective holes in the PCB, the latching pins are removable from the respective holes in the PCB by biasing the one or more of the latching pins in the second position where the one or more of the latching pins is/are substantially parallel to the central axis of the connector component responsive to the pinch tabs being pinched inward towards one another.

In accordance with certain embodiments, the connector component further includes at least one spring configured to bias at least one of the contact pins against a respective contact point on the PCB.

In accordance with certain embodiments, each of the electrically conductive contact pins is electrically coupled to a respective wire that is included within a cable that extends from a top of the body. The cable is configured to be selectively electrically connected to, or is permanently electrically connected to, a device to allow for at least one of powering, programming, debugging, configuring, monitoring, or testing of the PCB by the device, or to allow for at least one of powering, programming, debugging, configuring, monitoring, or testing of the device by the PCB.

In accordance with certain embodiments, at least one of the latching pins includes a circumferential groove proximal to a distal end of the latching pin and configured to further secure the connector component to the PCB by providing a flange that engages a portion of an underside of the PCB after the latching pins are inserted into the respective holes in the PCB and the pinch tabs are no longer being pinched inwards towards one another.

In accordance with certain embodiments, a distal portion of at least one of the latching pin includes a flange that engages a portion of an underside of the PCB after the latching pins are inserted into the respective holes in the PCB and the pinch tabs are no longer being pinched inwards towards one another.

Certain embodiments of the present technology are directed to a connector component for selectively connecting a PCB to a device that is distinct from the PCB, wherein the PCB includes a plurality of holes and a plurality of electrically conductive contact points. Such a connector component comprises a body including opposing sides at which are located pinch tabs, and a cable including a plurality of electrically conductive wires extending from a first portion of the body. Additionally, the connector component comprises electrically conductive contact pins each of which includes a portion thereof extending from a second portion of the body and each of which is electrically coupled to a respective one of the wires of the cable. The connector component also comprises latching pins each of which includes a portion thereof also extending from the second portion of the body. The pinch tabs are configured to normally bias the latching pins in a first position where the latching pins are angled relative to the contact pins when the pinch tabs are not being pinched inwards towards one another. Additionally, the pinch tabs are configured to bias the latching pins in a second position where the latching pins are substantially parallel to the contact pins when the pinch tabs are being pinched inward towards one another. The latching pins are configured to be inserted into respective holes in the PCB while the pinch tabs are being pinched inwards towards one another to bias the latching pins into the second position where the latching pins are substantially parallel to the contact pins. The electrically conductive contact pins are configured to come into contact with respective ones of the electrically conductive contact points on the PCB after the latching pins are inserted into respective holes in the PCB. The cable is permanently or selectively electrically connected to the device to allow for at least one of powering, programming, debugging, configuring, monitoring, or testing of the PCB by the device, or to allow for at least one of powering, programming, debugging, configuring, monitoring, or testing of the device by the PCB.

In accordance with certain embodiments, the latching pins attempt to return to the first position, where the latching pins are angled relative to the contact pins, after the latching pins are inserted into the respective holes in the PCB and the pinch tabs are no longer being pinched inwards towards one another, which causes at least a portion of each of the latching pins to apply a tangential force against at least a portion of a respective one of the holes in the PCB.

In accordance with certain embodiments, the connector component further comprises springs configured to bias the contact pins against respective ones of the electrically conductive contact points on the PCB.

In accordance with certain embodiments, each of the latching pins includes an upper portion and a lower portion, the upper portion located within the body, and the lower portion extending from the second portion of the body. Each of the pinch tabs engages an upper portion of at least one of the latching pins to normally bias the at least one of the latching pins in the first position when the pinch tabs are not being pinched inwards towards one another, and to bias the at least one of the latching pins in the second position where the latching pins are substantially parallel to the contact pins when the pinch tabs are being pinched inward towards one another.

In accordance with certain embodiments, each of the latching pins includes a circumferential groove configured to further secure the connector component to the PCB by providing flanges that engage portions of an underside of the PCB after the latching pins are inserted into the respective holes in the PCB and the pinch tabs are no longer being pinched inwards towards one another.

In accordance with certain embodiments, each of the latching pins includes a flange that engages a portion of an underside of the PCB after the latching pins are inserted into the respective holes in the PCB and the pinch tabs are no longer being pinched inwards towards one another.

In accordance with certain embodiments, a connector component is for selectively connecting to a secondary device, where the connector component comprises a body, a cable, electrically conductive contact pins, latching pins, and a pair of opposing tabs. The cable includes a plurality of electrically conductive wires extending from a first portion of the body. The electrically conductive contact pins are parallel to one another. Each of the electrically conductive contact pins includes a portion thereof that extends from a second portion of the body, and each of the electrically conductive contact pins is electrically coupled to a respective one of the wires of the cable. The latching pins are normally biased such that they are normally angled relative to the electrically conductive contact pins. Each of the latching pins including a portion thereof that also extends from the second portion of the body. The pair of opposing tabs are configured to assert a force on the latching pins, when the pair of opposing tabs are moved towards one another, to thereby cause the latching pins to become substantially parallel to the electrically conductive contact pins while the force is being asserted.

In accordance with certain embodiments, the latching pins are configured to be inserted into respective holes in the secondary device while the pair of opposing tabs are moved towards one another to thereby cause the latching pins to be substantially parallel to the electrically conductive contact pins.

In accordance with certain embodiments, after the latching pins are inserted into the respective holes in the secondary device and the tabs are no longer being moved towards one another, the latching pins attempt to return to being angled relative to the electrically conductive contact pins, which causes each of the latching pins to apply a tangential force against a respective one of the holes in the secondary device.

In accordance with certain embodiments, after the latching pins have been inserted into the respective holes in the secondary device, the latching pins are removable from the respective holes in the secondary by moving the opposing tabs towards one another to thereby cause the latching pins to be substantially parallel to the electrically conductive contact pins.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIGS. 1A, 1B, and 1C can be referred to herein collectively as FIG. 1.

DETAILED DESCRIPTION

Figure 1A:
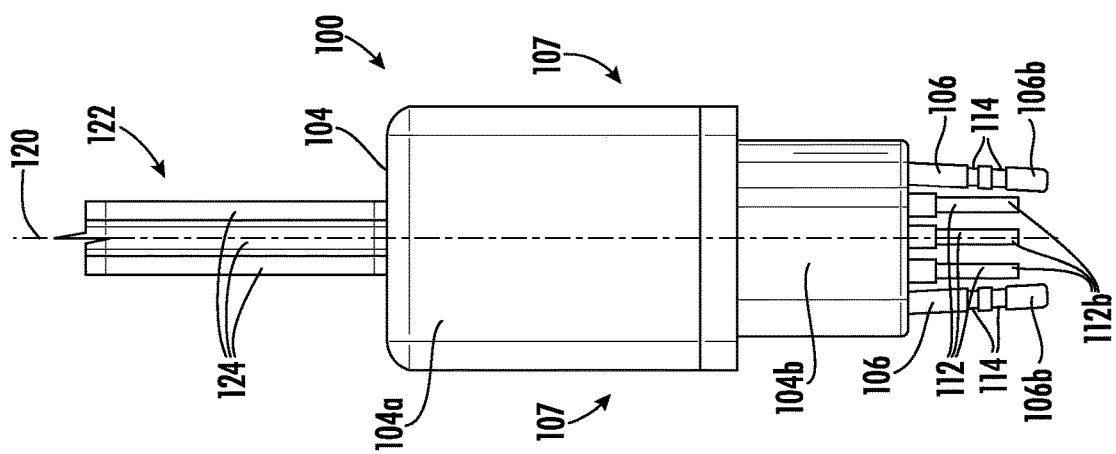
FIGS. 1A, 1B, and 1C are respectively, a plan view, a side view, and a cross-sectional view (along line C-C in FIG. 1B) of a connector component accordance to an embodiment of the present technology.
Figure 1B:
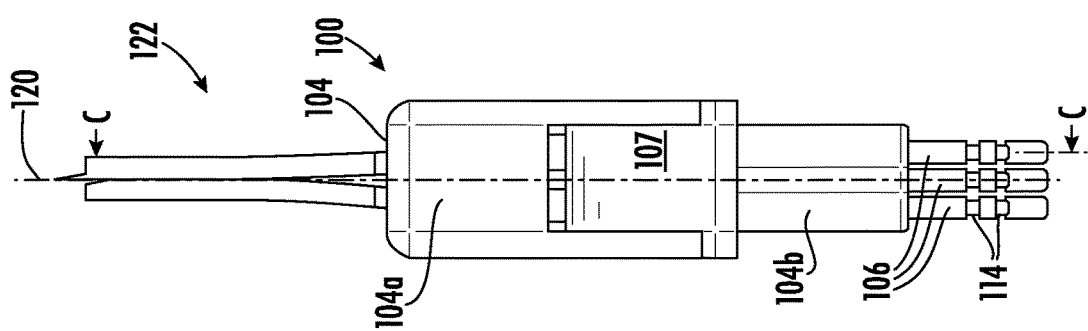
Figure 1C:
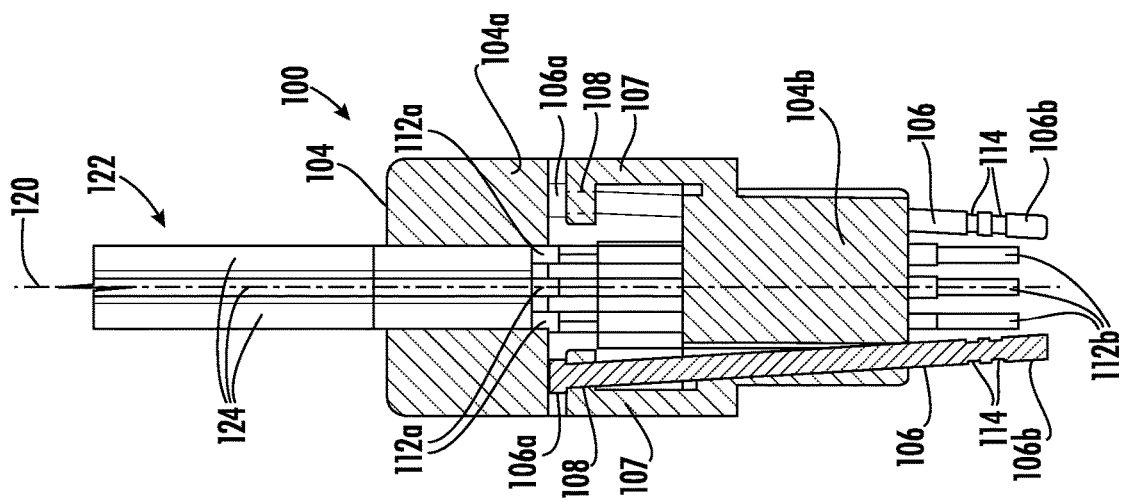

Embodiments of the present technology will now be described with reference to the figures (FIGS.), which in general relate to an electrical connector component for removably connecting an electrical or other component to a PCB or some other type of secondary device. FIGS. 1A, 1B, and 1C are respectively, a plan view, a side view, and a cross-sectional view (along line C-C in FIG. 1B) of a connector component 100 accordance to an embodiment of the present technology. FIGS. 1A, 1B, and 1C can be referred to herein collectively as FIG. 1. As will be appreciated from the below description, the connector component 100 is configured to be selectively affixed to a secondary device, such as a PCB. An example of such a PCB is labeled 101 in FIGS. 3-6 discussed below. The connector component 100 can also be referred to herein more succinctly as a connector 100, or as a component 100, or as a connector device 100.

The connector component 100 includes a body 104, and movable latching pins 106 and electrically conductive contact pins 112 that extend from a lower portion 104b of the body 104. Each of the movable latching pins 106 includes a first end 106a within the body 104, and a second end 106b extending outward (e.g., downward) from the lower portion 104b of the body 104 and configured to engage a PCB (e.g., 101) to affix the connector component 100 to the PCB. The first ends 106a of the latching pins 106 can also be referred to as the upper ends 106a or the proximal ends 106a of the latching pins 106. The second ends 106b of the latching pins 106 can also be referred to herein as the lower ends 106b or the distal ends 106b of the latching pins 106. It is the distal ends 106b of the latching pins 106 that are configured to engage a PCB (e.g., 101) by insertion thereof into holes (e.g., 102) in the PCB. In the cross-sectional views of FIGS. 1C, 2, 3, and 5, the left-most latching pin 106 is shown in black or dark-grey with a section of the body 104 that would actual hide portions of the left-most latching pin 106 removed from the FIGS. in order to better show how the latching pins 106 can be biased between first and second positions. The latching pins 106 can also be referred to as alignment pins 106, or latching/alignment pins 106, since they are used to both latch the connector component 100 to a PCB or other secondary device, and align contact pins of the connector component 100 with contact points on the PCB or other secondary device.

In the drawings (e.g., see FIGS. 1B, 4 and 6) the connector 100 is show as having three latching pins 106, but there may be more or less than that in other embodiments. The body 104 and/or latching pins 106 can be molded or 3D printed, or can be manufactured in some other manner. The body 104 can be made of a non-conductive material, such as plastic, or resin, but is not limited thereto. The body 104 may be one-piece, such as integrally formed or can be comprised of multiple sections attached together. Where the body 104 includes multiple sections, at least a portion of the body 104 can be made of ceramic. The latching pins 106 can also be made of a non-conductive material, such as plastic, resin, or ceramic, but are not limited thereto. While a specific shape and size of the body 104 is shown in the FIGS., the body 104 can have a myriad of other shapes and sizes that are within the scope of the embodiments describe herein. In certain embodiments, the body 104 of the connector component 100 is optionally coated in a conductive material to provide electromagnetic interference (EMI) shielding. Depending upon the specific implementation, the connector component 100 may also be symmetrically or asymmetrically formed.

The connector component 100 also includes one or more electrically conductive contact pins 112 extending from the lower portion 104b of the body 104, e.g., vertically downwards, to align with and come into electrical contact with contact points 103 on the PCB 101. Such contact points 103 on the PCB 101 may be electrically conductive pads, recessed portions with conductive material within, ends of conductive traces, or may have various other configurations. More specifically, lower or distal ends 112b of the contact pins 112 are configured to align with and come into electrical contact with the contact points 103 on the PCB 101. In accordance with certain embodiments, the PCB 101 preferably includes at least as many contact points 103 as contact pins 112 of the connector component 100 so that each of the contact points 103 is aligned with a respective one of the contact pins 112 to be engaged by the contact pins 112 when the connector component 100 is secured to the PCB 101. The holes 102 in the PCB 101 are generally positioned close to and near a perimeter around the contact points 103. The holes 102 receive the latching pins 106 of the connector component 100 to further secure the connector component 100 in a desired position relative to the PCB 101 and to prevent the connector component 100 from being rotated or moved unwillingly while the latching pins 106 are positioned within the holes 102. The holes 102 are also generally close fitting with respect to the latching pins 106. Where the latching pins 106 have a generally cylindrical shape with a circular cross-section, the holes 102 are preferably round with a circumference that is slightly larger than the circumference of the cylindrical shaped latching pins 106. However, it is noted that the holes 102 can other shapes, such as square, oval, pentagonal, hexagonal, etc., preferably to match the shape of the cross-section of the latching pins 106. Accordingly, if the latching pins 106 have a square cross-section, the holes 102 preferably are square shaped holes that are slightly larger than the square cross-section of the latching pins. Where the holes 102 extend through an entire thickness of the PCB 101, which will typically be the case, the holes 102 can be referred to more specifically as through-holes or thru-holes.

In certain embodiments, if a lower end 112b of a contact pin 112 is damaged or for any other reason must be replaced, it can be pulled out and replaced without affecting the upper portion 112a of the contact pin 112 connected to the cable 122. Other embodiments may make use of one-piece contact pins 112 or contact pins 112 of more than two components. The preferred embodiment shows the contact pins 112 parallel to the central or longitudinal axis 120 of the connector component 100. In other embodiments, the contact pins 112 may have other orientations with respect to the central or longitudinal axis 120. The tips of the contact pins 112 that are to contact the PCB 101 also preferably define a plane. In other embodiments, the tips of the contact pins 112 may lie on more than one plane, may define a geometrical shape other than a plane, or may have any other spatial arrangement.

Circuitry, cables, contact pins, and the like, may be assembled or affixed to each other by a variety of means including over molding, soldering, crimping, riveting, casting, extruding, stamping, putting in place or in addition to the contact pins 112. In other embodiments (for example a light pipe design) the entire connector component 100 may be a single formed or fabricated component, or features formed from separate components may be formed from one or more common components. In an over mold embodiment, the body 104 may be over molded onto the contact pins 112. The connector component 100 may also be over molded onto both the contact pins 112 and the cable 122 to form a single entity. Such an embodiment greatly increases the robustness of the connector component 100 as it protects the connections between the contact pins 112 and the cable 122 from damage.

The PCB 101 can be single-sided (e.g., have one copper layer), double-sided (e.g., have two copper layers, with one on each of two sides of one substrate layer), or multi-layer (e.g., outer and inner layers of copper, alternating with layers of non-electrically conductive substrates). One or more chips and/or other types of circuit elements, such as resistors, capacitors, inductors, transistors, diodes, etc., can be mounted to the PCB 101, but are not shown for ease of illustration and to reduce clutter in the FIGS. One or more such circuit components can be surface-mount devices (SMDs). Alternatively, or additionally, one or more circuit components can be embedded within the PCB 101.

Upper or proximal ends 112a of the contact pins 112 are electrically connected (e.g., via clips, soldering and/or crimping) to a respective electrically conductive wire 124 that is included within a cable 122 (a.k.a. a cord 122) that may have an insulated outer sheath. The contact pins 112 thereby provide the primary electrical connection for the connector component 100 with the PCB 101. While three contact pins 112 are shown in the FIGS., the connector component 100 can include more or less than three contact pins 112.

The cable 122 that extends from an upper portion 104a of the body 104 can lead to a device (e.g., 140 in FIG. 6) that is adapted to be powered or controlled via the PCB 101, or which is configured to power or control the PCB 101. Alternatively, the device (e.g., 140 in FIG. 6) to which the cable 122 leads can be used to program, debug, configure, monitor, and/or test of the PCB 101 to which the connector component 100 is connected, and more specifically, electrical components attached to or embedded within the PCB 101. Alternatively, or additionally, the device (e.g., 140 in FIG. 6) to which the cable 122 leads can be used to power electrical components on the PCB 101 to which the connector component 100 is connected. It is also possible that the device (e.g., 140 in FIG. 6) to which the cable 122 leads can be programmed, debugged, configured, monitored, and/or tested by the PCB 101. Such a device to (e.g., 140 in FIG. 6) to which the cable 122 leads can include hardware (e.g., circuitry, one or more field programmable gate arrays (FPGAs), and/or one or more processors), software, firmware, or combinations thereof. Other variations are also possible and within the scope of the embodiments described herein.

In some embodiments, the cable 122 comprises a ribbon cable or a cable with multiple conducting wires 124 running parallel to each other. In other embodiments, the cable 122 comprises a group of wires 124 bundled together. The wires 124 may be integral with the upper ends of the contact pins 112 or may be attached in various manners, such as by clips, soldering or crimping, but not limited thereto. The cable 122 can be permanently connected directly to a device (e.g., 140 in FIG. 6). Alternatively, the distal end of the cable 122 can include an adaptor that enables the cable 122 to be selectively connected to and disconnected from the device (e.g., 140 in FIG. 6), wherein such an adaptor can, e.g., have the form of a female or male Universal Serial Bus (USB) connector, or an Ethernet RJ45 connector, or alternative types of female or male type connectors, but is not limited thereto. It is also possible that the cable 122 is permanently connected to a device (e.g., 140 in FIG. 6) that is configured to be selectively connected to a PCB (e.g., 101) or some other secondary device. It is appreciated that rather than being connected to wires within the cable 122, the contact pins 112 may be exposed or various types of plugs or sockets may be located upon the body 104, which are in electrical contact with the contact pins 112. It would also be possible for the contact pins 112 may be connected to a wireless transceiver that can be used to wirelessly transfer signals to and/from the contact pins to a remote device. In an embodiment, such a wireless transceiver can be included within the body 104 of the connector component 100. It is also within the scope of the embodiments described herein that a small PCB, processor, micro-controller unit (MCU), FPGA, and/or the like be included within the body 104 of the connector component 100, potentially eliminating the need for the connector component 100 to be connected via a cable 122 or wirelessly to a further device (e.g., the device 140 in FIG. 6). In other words, it is possible that the functionality of the device 140 discussed below with reference to FIG. 6 to be incorporated into circuitry that is included within the body 104 of the connector component 100. Where the body 104 includes such circuitry, the body 104 may also include one or more light emitting diodes (LEDs) or the like, that light up or change color to indicate a status of the connector component 100 or circuitry thereof.

Figure 2:
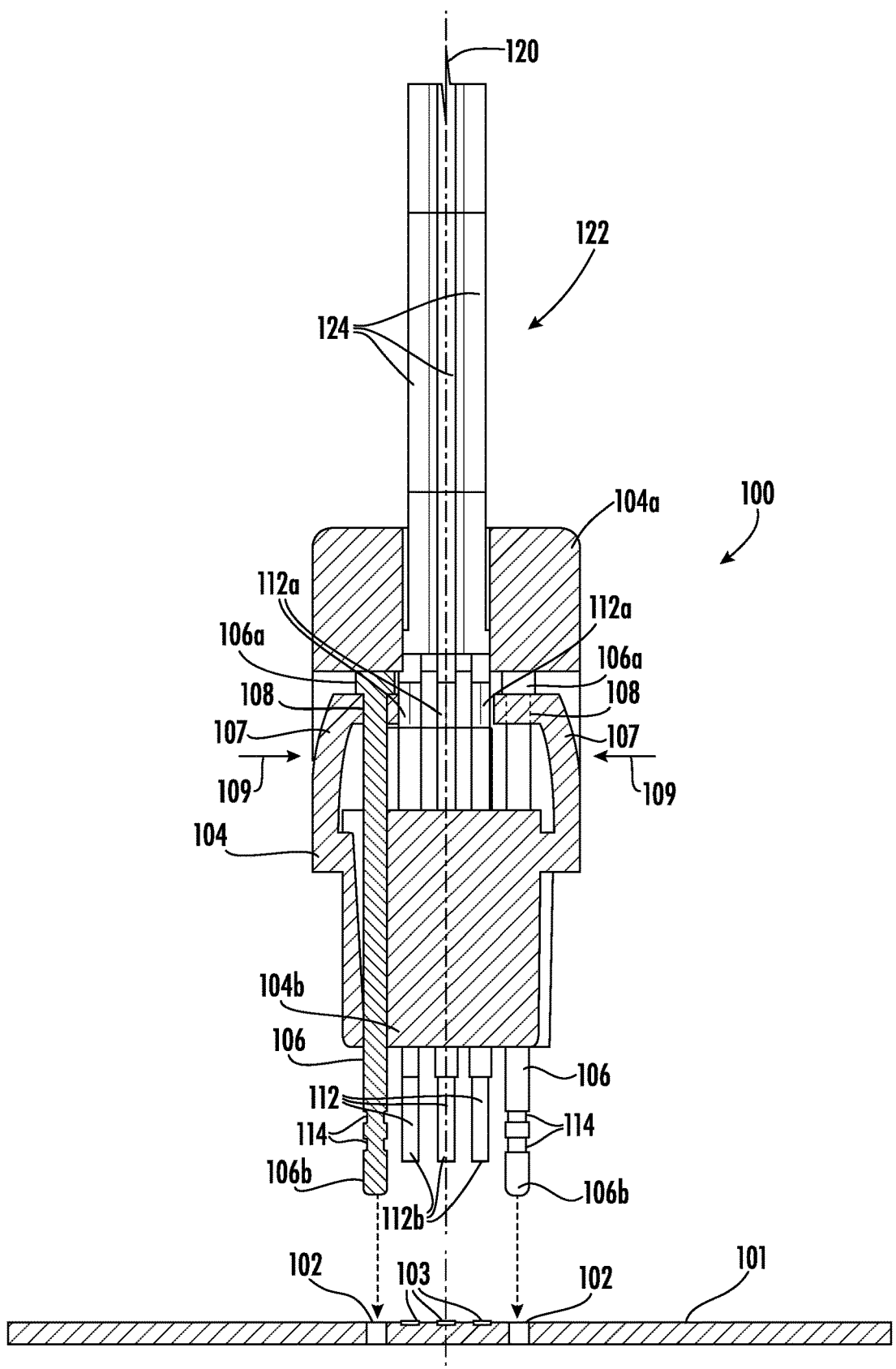
FIG. 2 is a cross-sectional view of the connector component while its pinch tabs are being pinched, and also a cross-sectional view of a PCB to which the connector component is being connected.
Figure 3:
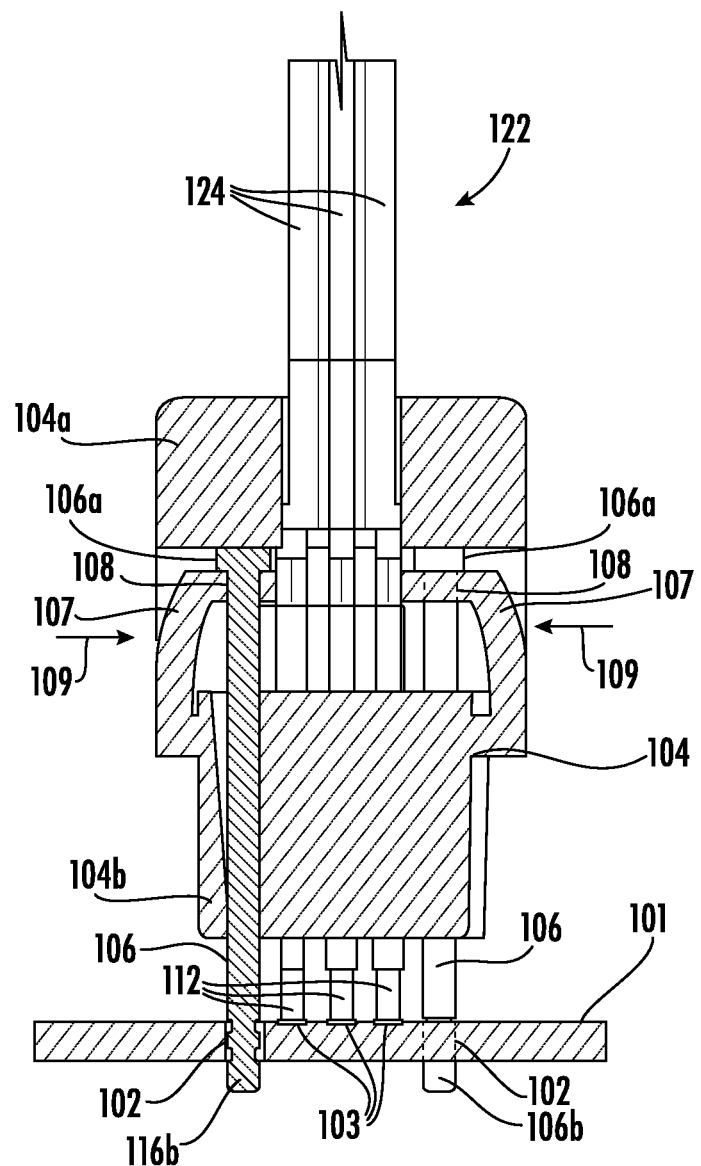
FIG. 3 is a cross-sectional view of the connector component while its pinch tabs 107 are being pinched and its latching pins have been inserted through holes in the PCB.
Figure 4:
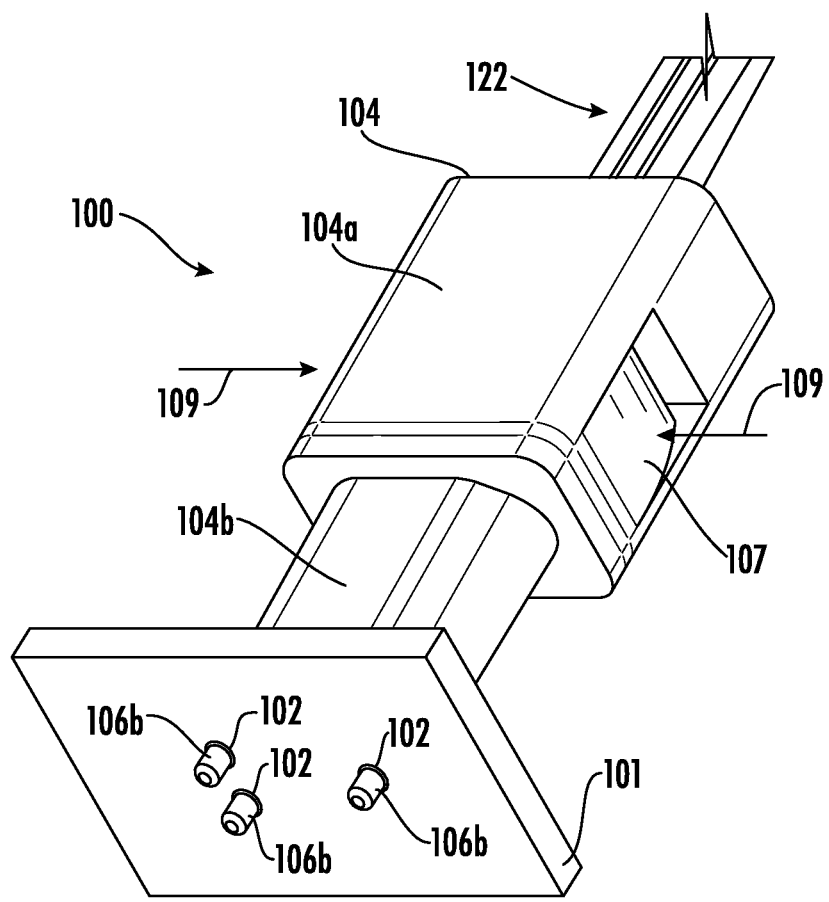
FIG. 4 is a perspective view of the connector component while its pinch tabs are being pinched and its latching pins have been inserted through holes in the PCB.

The latching pins 106 are mounted through at least a portion of the body 104. The body 104 includes a pair of pinch tabs 107 capable of deforming inward (toward a central axis 120 of the component 100) when pressed in the direction of the arrows 109, for example by a pair of digits (e.g., a thumb and index finger) on either pinch tab 107. The first ends 106a are inserted through respective holes 108 in the pinch tabs 107. The latching pins 106 are normally angled inward at an acute angle (e.g., in the range of about 5 to 10 degrees) relative to the contact pins 112 and the central axis 120. When the pinch tabs 107 are pinched inward, in the direction of the arrows 109, the latching pins 106 generally straighten (e.g., align substantially parallel to the central axis 120). This generally straightened position is shown in FIGS. 2-4. While straightened, the latching pins 106 are substantially parallel to the contact pins 112. The terminal substantially parallel, as used herein, means within +/−2 degrees of being parallel.

When straightened, as in FIGS. 2-4, the latching pins 106 move to align with holes 102 in the PCB 101 for insertion of the second ends 106b of the latching pins 106 through the holes 102 in the PCB 101, as best shown in FIGS. 3 and 4. The force applied to the pinch tabs 107, and the amount the pinch tabs 107 deflect inward, can serve to align the second ends 106b of the latching pins 106 with the holes 102 in the PCB 101. The latching pins 106 are straight in order to align the latching pins 106 in the holes 102. The pinch tabs 107 are deformed and held by using a typical pinch and hold method (e.g., using a thumb and index finger) during insertion.

Figure 5:
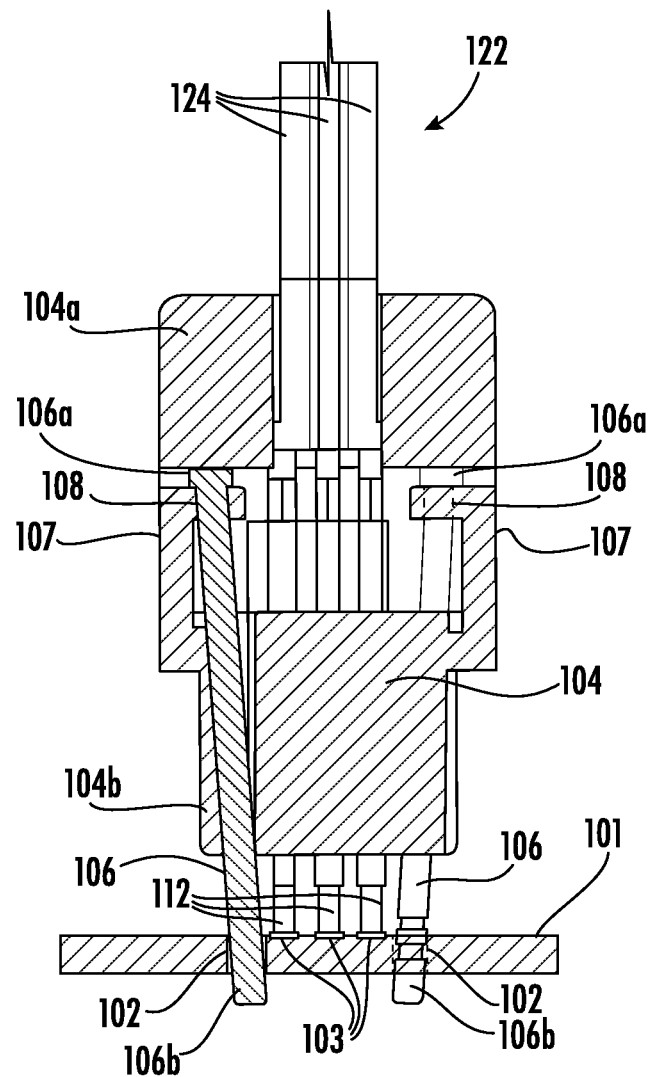
FIG. 5 is a cross-sectional view of the connector component after its latching pins have been inserted through holes in the PCB and its pinch tabs are no longer being pinched.
Figure 6:
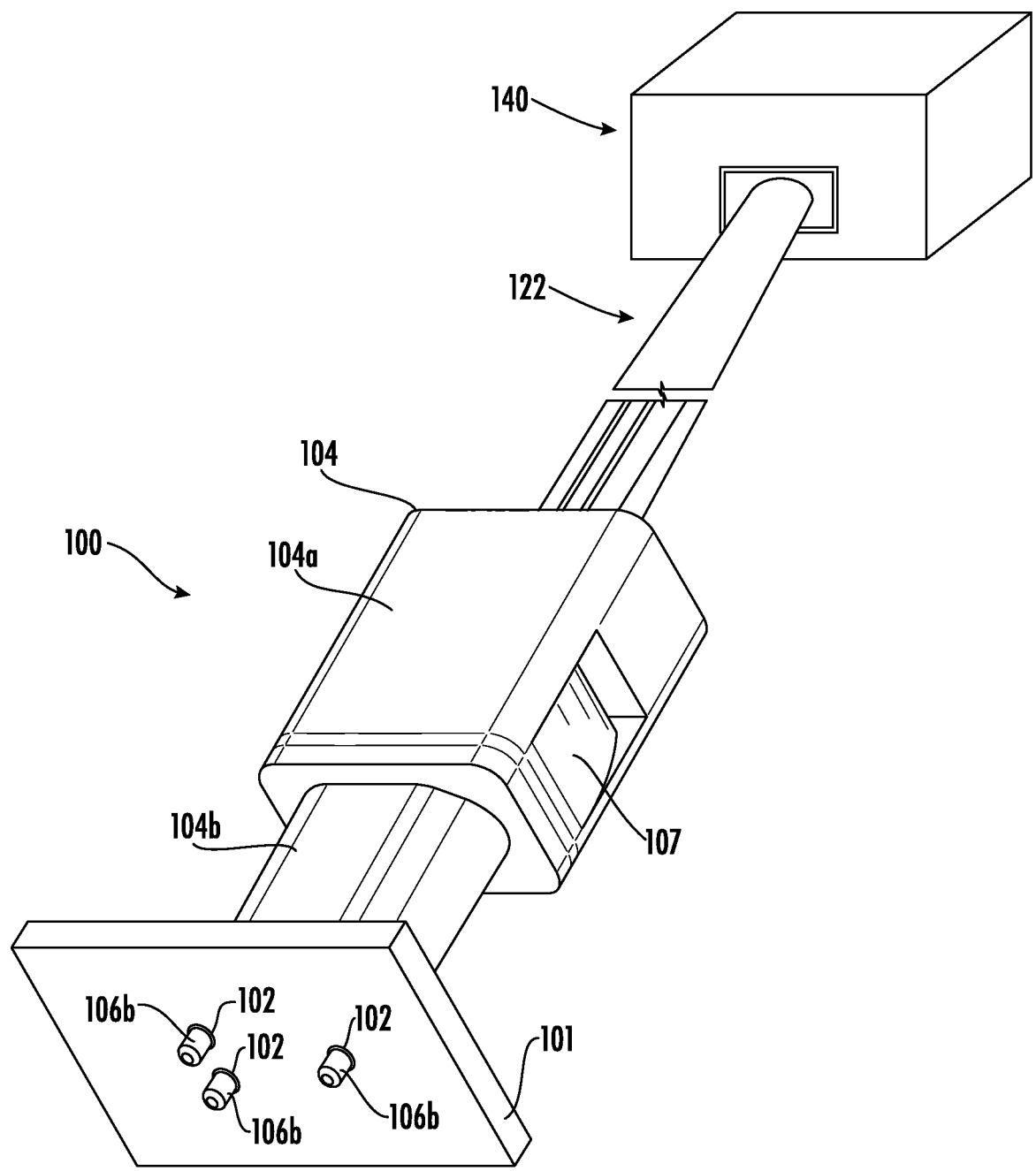
FIG. 6 is a perspective view of the connector component after its latching pins have been inserted through holes in the PCB and its pinch tabs are no longer being pinched.

Upon releasing the pinch tabs 107, the pinch tabs 107 move outward (e.g., away from central axis 120) to their unbiased position. When the pinch tabs 107 move outward to their unbiased positions, the latching pins 106 bend or angle outward, as shown in FIGS. 5 and 6. In their angled positions, the second ends 106b lock the latching pins 106 in the holes 102, thereby fixedly mounting the connector component 100 to the PCB 101. After Insertion of the latching pin 106 into the holes 102 in the PCB 101, the force that was applied to move the pinch tabs 107 toward one another is released, and the pinch tabs 107 due to their bias completely, or at least partially, move back to their former position. The movement creates deflection on the upper portions 106a of the latching pins 106 and the force applied to the latching pins 106 causes them to grab the PCB at the hole interfaces. Preferably, the latching pins 106 are inserted in a way that they do not have sufficient movement in the axial direction due to the geometry of the part holding them in place.

Figure 8:
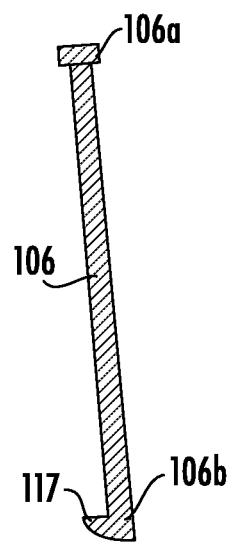
FIG. 8 is a cross-sectional view of an alternative latching pin that includes an outwardly extending flange at its distal end, rather than one or more grooves, as shown in the other FIGS.

In certain embodiments, the second end 106b of each of the latching pins 106 includes one or more grooves 114. In certain embodiments, the grooves 114 are circumferential grooves proximal to second ends 106b of the latching pins 106 and are configured to further secure the connector component 100 to the PCB 101 by providing a flange that engages a portion of an underside of the PCB 101 after the latching pins 106 are inserted into the respective holes 102 in the PCB 101 and the pinch tabs 107 are no longer being pinched inwards towards one another. In other words, when the pinch tabs 107 are released and the latching pins 106 move to their angled positions, the edges of the PCB 101 at holes 102 apply a tangential force to the grooves 114 at the second ends 106b of the latching pins 106, and vice versa. The grooves 114 engage the edges of the PCB 101 at holes 102 when the latching pins 106 are angled, so that the latching pins 106 are held in the holes 102. The grooves 114 can be added to the latching pins 106 at different locations along the latching pins to accommodate stronger latching and variations in the PCB thicknesses. Multiple grooves 114 in each of the latching pins 106 can also be used to help hold the latching pins to a stack of two or more PCBs. Instead of including grooves 114 proximate to the second ends 106b of the latching pins 106, outwardly (or inwardly) extending flanges 117 can be included proximate the second ends 106b of the latching pins 106, e.g., as shown in FIG. 8. It is also possible for the latching 106 pins to have various other cross-sections and/or geometries than shown. For example, in certain embodiments the second ends 106b of the latching pins 106 are generally rounded and do not include any grooves or flanges. The cross-sections of the latching pins 106 can be circular as shown, or alternatively oval, square, rectangular, or hexagonal, but not limited thereto.

In accordance with certain embodiments, the latching pins 106 are inserted in a way that they do not have sufficient movement in the axial direction (e.g., along axis 120) due to the geometry of the plastic part holding them in place. When locked to the PCB 101, the latching pins 106 hold conductive pins 120 against the PCB 101, and more specifically, in electrical contact with the contact points 103 on the PCB 101, as shown, e.g., in FIGS. 2, 3 and 5.

Figure 7:
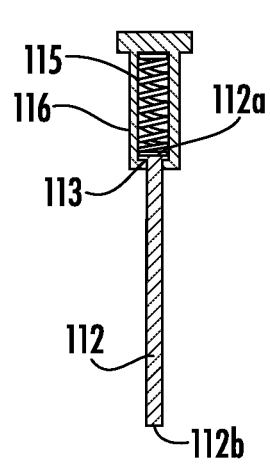
FIG. 7 is a cross-sectional view of a contact pin that includes a spring that enables the contact pin to be vertically adjusted.

In certain embodiments, the contact pins 112 are spring loaded. More specifically, in certain embodiments the contact pins 112 include springs that bias distal ends of the contact pins downward to improve the electrical connection between the distal ends 112b of the contact pins 112 and contact points 103 on the PCB 101. An example cross-sectional view of a contact pin 112 with a spring 115 is shown in FIG. 7. Referring to FIG. 7, the distal end 112b of the contact pin 112 is able to vertically adjust via the spring 115. The spring 115 is interconnected between a catch portion 113 of the contact pin 112 and the lower portion 104b of the body 104. The spring 115 may also be retained in place by a retainer 116 surrounding the spring 115. It is appreciated that the spring 115 may extend around the contact pin 112 or may be positioned at an end of the contact pin 112, wherein the catch portion 113 forms the top of the contact pin 112. Depending upon the specific implementation, an upper portion of the contact pin 112 can be electrically connected to a respective one of the wires 124, directly, or via the spring and/or retainer 116, assuming the spring and retainer 116 are made of an electrically conductive material, such as a metal or alloy. It should be appreciated that the springs 115 may be omitted, included in only some of the contact pins 112 or integral with the contact pins 112.

In certain embodiments, the lower end 112b of the contact pin 112 is able to adjust vertically upwards when moving the connector component 100 closer to the PCB 101 via extending the latching pins 106 through the holes 102 in the PCB 101. When flanges provided by grooves 114 (or some other type of flanges, such as the flange 117 in FIG. 8) catch the bottom of the PCB 101, the spring 115 exerts an outward force against the contact pin 112 towards the PCB 101 thus forcing the contact pin 112 to remain engaged to the contact point 103 of the PCB 101 and to maintain the spatial relationship between the body 104 and the PCB 101 via effectively sandwiching the PCB 101 between the contact pins 112 and the upper surface of the flanges on the lower ends 106b of the latching pins 106. The contact pins 112 may additionally or alternatively be comprised of a telescoping structure. For example, telescoping spring-loaded contact pins 112 can compress their springs 115 when pressed against the top surface of PCB 101. It is also appreciated that other embodiments may use rigid, flexible or other styled contact pins 112. It is appreciated that the contact pins 112 may be inserted into plated holes within the contact points 103 to help align the contact pins 112. The tips of the contact pins 112 may be sharp, dull, rounded, include crowns, or be textured to contact multiple contact points 103. Instead of each contact pin 112 including a respective spring 115, each contact pin 112 itself can be an elastomeric electronic connector. Such elastomeric electronic connector type contact pins 112 can comprise alternating conductive and insulating regions in a rubber or elastomer matrix to produce overall anisotropic conductive properties. Other variations are possible and within the scope of the embodiments of the present technology.

In the FIGS. and the above descriptions thereof, the latching pins 106 were shown and described as being normally angled inward at an acute angle (e.g., in the range of about 5 to 10 degrees) relative to the contact pins 112 and the central axis 120, and becoming generally straightened in response to the pinch tabs 107 being pinched inward. In alternative embodiments, the latching pins 106 can instead be normally angled outward at an acute angle (e.g., in the range of about 5 to 10 degrees) relative to the contact pins 112 and the central axis 120, and can become generally straightened in response to the pinch tabs 107 being pinched inward. Such alternative embodiments can be implemented by adjusting the interface between the latching pins 106 and the pinch tabs 107, including where and how the pinch tabs 107 cause the latching pins 106 to pivot (e.g., about a fulcrum) responsive to the pinch tabs 107 being pinched inward. Other variations are also possible and within the scope of the embodiments described herein.

The pinch tabs 107 can be pinched inwards by a pair of digits (e.g., a thumb and index finger), as mentioned above. Other variations are also possible. For example, a sleeve having a pair of inward facing bumps that generally face one another can be normally positioned above or below the body 104, and can be slid downward or upward to cause the bumps to come into contact with the pinch tabs 107 and move the pinch tabs 107 inward to cause the latching pins 106 to pivot responsive to the pinch tabs 107 being pinched inward. It would also be possible for such a sleeve to normally pinch the pinch tabs 107 inward such that the latching pins 106 are normally straight. Then after the latching pins 106 are inserted into respective holes 102, the sleeve can be pushed upward or downward to release the pinch tabs 107 and cause the latching pins 106 to try to become angles and lock the connector component 100 in place. The use of other types of slide mechanisms besides a sleeve are also possible and within the scope of the present technology. Other variations are also possible and within the scope of the embodiments described herein.

In certain embodiments, each of the latching pins 106 can be normally angled inward (or outward) at an acute angle relative to the contact pins 112 and the central axis 120, and can be generally straightened in response to the pinch tabs 107 being pinched inward. In other embodiments, only some (e.g., one or more) of the latching pins 106 can be normally angled inward or outward, and one or more other latching pin(s) 106 can be normally and fixedly straight and parallel to the contact pins 112 and the central axis 120. In such embodiments, only those latching pin(s) 106 that is/are biased to be angled inward or outward would be generally straightened in response to the pinch tabs 107 being pinched inward.

In certain embodiments, the latching pins 106 are made of a dielectric material that is not electrically conductive. In other embodiments, one or more of the latching pins 106 could be made entirely of or partially of an electrically conductive material, and can function as an electrical contact to one or more respective through-holes 102 in the PCB 101 that is/are electrically plated. For an example, an electrically conductive latching pin 106 can be used as a grounding pin that ensures a grounding connection prior to the contact pins 112 coming into contact with respective contact points 103 on the PCB 101. Alternatively, or additionally, one or more electrically conductive latching pin 106 can be used to carry electrical signals, and thus, can provide a similar capability to the contact pins 112. Other variations are also possible and within the scope of the embodiments described herein.

In the above described embodiments, the connector component 100 was described and shown as being used to selectively connect the body 104 thereof to a PCB 101 so that contact pins 112 of the connector component 100 are in electrical contact with electrically conductive contact points 103 on the PCB 101. This provides for an electrical connection between the PCB 101 and a device (e.g., 140 in FIG. 6) to which the cable 122 extending from the top of the housing 104 the connector component 100 is attached, to thereby enable the device to power, program, debug, configure, monitor, and/or test of the PCB 101, or vice versa. Rather than (or in addition to) the connector component 100 including electrically conductive contact pins 106 that are configured to come into electrical contact with contact points 103 on the PCB 101, the connector component 100 can include one or more optical elements (e.g., light emitting diodes, laser diodes, and/or photodetectors), inductors, auditory transducers, and/or the like, that are intended to be appropriately aligned with corresponding and complementary features on the PCB 101 (or some other secondary device), to illuminate, receive illumination, magnify, channel (e.g., light pipe) or reflect optical, electrical, or auditory energy, provide power to or from, or provide charge to or from, the PCB 101 (or some other secondary device).

In the above described embodiments, the connector component 100 was described and shown as being used to selectively connect the body 104 thereof to a PCB 101. In alternative embodiments, the connector component 100 can be selectively connected to some other type of secondary device besides a PCB 101. Examples of other secondary devices (besides a PCB 101) that the connector component 100 can be selectively connected to include, e.g., a flex circuit, a chip on glass, hybrid and ceramic boards, optical circuits, and other devices. It should be appreciated that the term secondary device may be used to refer to any such device, platform, object, board, or thing that is used to receive the connector component 100. Other types of secondary devices may not be electrical or optical in nature, e.g., the secondary devices used rather than a PCB may be structural (e.g. part of a building, furniture, machinery, tool, or equipment), textile, paper or plastic, or otherwise primarily mechanical or aesthetic in nature. Secondary devices may be raw or partially processed components of an assembly or fabrication process.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A connector component for selectively connecting to a printed circuit board (PCB), the connector component comprising:
   a body including opposing sides at which are located pinch tabs;
   one or more electrically conductive contact pins each of which includes a portion thereof extending from a bottom of the body; and
   latching pins each of which includes a portion thereof also extending from the bottom of the body;
   the pinch tabs configured to bias one or more of the latching pins in a first position where the one or more of the latching pins is/are angled relative to a central axis of the connector component when the pinch tabs are not being pinched inwards towards one another; and
   the pinch tabs configured to bias the one or more of the latching pins in a second position where the one or more of the latching pins is/are substantially parallel to the central axis of the connector component when the pinch tabs are being pinched inward towards one another.

2. The connector component of claim 1, wherein:
   each of the latching pins includes an upper portion and a lower portion, the upper portion located within the body, and the lower portion extending from the bottom of the body;
   each of the pinch tabs engages the upper portion of at least one of the latching pins to normally bias the at least one of the latching pins in the first position when the pinch tabs are not being pinched inwards towards one another, and to bias the at least one of the latching pins in the second position where the latching pins are substantially parallel to the central axis of the connector component when the pinch tabs are being pinched inward towards one another.

3. The connector component of claim 1, wherein:
   the latching pins are configured to be inserted into respective holes in the PCB while the pinch tabs are being pinched inwards towards one another to bias the one or more of the latching pins into the second position where the latching pins are substantially parallel to the central axis of the connector component.

4. The connector component of claim 3, wherein:
   the one or more of the latching pins attempt to return to the first position, where the one or more of the latching pins are angled relative to the central axis of the connector component, after the latching pins are inserted into the respective holes in the PCB and the pinch tabs are no longer being pinched inwards towards one another, which causes at least a portion of an outer peripheral surface of each of the latching pins to apply a tangential force against at least a portion of an inner peripheral surface of a respective one of the holes in the PCB.

5. The connector component of claim 4, wherein:
the electrically conductive contact pins are configured to come into contact with respective electrically conductive contact points on the PCB after the latching pins are inserted into the respective holes in the PCB.

6. The connector of claim 4, wherein:
after the latching pins have been inserted into the respective holes in the PCB, the latching pins are removable from the respective holes in the PCB by biasing the one or more of the latching pins in the second position where the one or more of the latching pins are substantially parallel to the central axis of the connector component responsive to the pinch tabs being pinched inward towards one another.

7. The connector component of claim 1, further comprising:
at least one spring configured to bias at least one of the contact pins against a respective contact point on the PCB.

8. The connector component of claim 1, wherein:
each of the electrically conductive contact pins is electrically coupled to a respective wire that is included within a cable that extends from a top of the body; and
the cable is configured to be selectively electrically connected to, or is permanently electrically connected to, a device to allow for at least one of powering, programming, debugging, configuring, monitoring, or testing of the PCB by the device, or to allow for at least one of powering, programming, debugging, configuring, monitoring, or testing of the device by the PCB.

9. The connector component of claim 1, wherein:
at least one of the latching pins includes a circumferential groove proximal to a distal end of the latching pin and configured to further secure the connector component to the PCB by providing a flange that engages a portion of an underside of the PCB after the latching pins are inserted into the respective holes in the PCB and the pinch tabs are no longer being pinched inwards towards one another.

10. The connector component of claim 1, wherein:
a distal portion of at least one of the latching pins includes a flange that engages a portion of an underside of the PCB after the latching pins are inserted into the respective holes in the PCB and the pinch tabs are no longer being pinched inwards towards one another.

11. A connector component for selectively connecting a printed circuit board (PCB) to a device that is distinct from the PCB, wherein the PCB includes a plurality of holes and a plurality of electrically conductive contact points, the connector component comprising:
a body including opposing sides at which are located pinch tabs;
a cable including a plurality of electrically conductive wires extending from a first portion of the body;
electrically conductive contact pins each of which includes a portion thereof extending from a second portion of the body and each of which is electrically coupled to a respective one of the wires in the cable; and
latching pins each of which includes a portion thereof also extending from the second portion of the body;
the pinch tabs configured to normally bias one or more of the latching pins in a first position where the latching pins are angled relative to the contact pins when the pinch tabs are not being pinched inwards towards one another;
the pinch tabs configured to bias the one or more of the latching pins in a second position where the one or more of the latching pins is/are substantially parallel to the contact pins when the pinch tabs are being pinched inward towards one another;
the latching pins configured to be inserted into respective holes in the PCB while the pinch tabs are being pinched inwards towards one another to bias the one or more of the latching pins into the second position where the latching pins are substantially parallel to the contact pins; and
the electrically conductive contact pins configured to come into contact with respective ones of the electrically conductive contact points on the PCB after the latching pins are inserted into respective holes in the PCB.

12. The connector component of claim 11, wherein:
the cable is permanently or selectively electrically connected to the device that is distinct from the PCB to allow for at least one of powering, programming, debugging, configuring, monitoring, or testing of the PCB by the device, or to allow for at least one of powering, programming, debugging, configuring, monitoring, or testing of the device by the PCB.

13. The connector component of claim 11, wherein:
the one or more of the latching pins attempt to return to the first position, where the one or more of the latching pins is/are angled relative to the contact pins, after the latching pins are inserted into the respective holes in the PCB and the pinch tabs are no longer being pinched inwards towards one another, which causes at least a portion of each of the one or more of the latching pins to apply a tangential force against at least a portion of a respective one of the holes in the PCB.

14. The connector component of claim 11, further comprising:
springs configured to bias the contact pins against respective ones of the electrically conductive contact points on the PCB.

15. The connector component of claim 11, wherein:
each of the latching pins includes an upper portion and a lower portion, the upper portion located within the body, and the lower portion extending from the second portion of the body; and
each of the pinch tabs engages the upper portion of at least one of the latching pins to normally bias the at least one of the latching pins in the first position when the pinch tabs are not being pinched inwards towards one another, and to bias the at least one of the latching pins in the second position where the latching pins are substantially parallel to the contact pins when the pinch tabs are being pinched inward towards one another.

16. The connector component of claim 11, wherein:
each of the latching pins includes a circumferential groove configured to further secure the connector component to the PCB by providing flanges that engages portions of an underside of the PCB after the latching pins are inserted into the respective holes in the PCB and the pinch tabs are no longer being pinched inwards towards one another.

17. A connector component for selectively connecting to a secondary device, the connector component comprising:
a body;
a cable including a plurality of electrically conductive wires extending from a first portion of the body;
electrically conductive contact pins that are parallel to one another, each of the electrically conductive contact pins including a portion thereof that extends from a second portion of the body, and each of the electrically conductive contact pins electrically coupled to a respective one of the wires in the cable;
latching pins that are normally biased such that they are normally angled relative to the electrically conductive contact pins, each of the latching pins including a portion thereof that also extends from the second portion of the body; and
a pair of opposing tabs that are configured to assert a force on the latching pins, when the pair of opposing tabs are moved towards one another, to thereby cause the latching pins to become substantially parallel to the electrically conductive contact pins while the force is being asserted.

18. The connector component of claim 17, wherein:
the latching pins are configured to be inserted into respective holes in the secondary device while the pair of opposing tabs are being moved towards one another to thereby cause the latching pins to be substantially parallel to the electrically conductive contact pins.

19. The connector component of claim 18, wherein:
after the latching pins are inserted into the respective holes in the secondary device and the tabs are no longer being moved towards one another, the latching pins attempt to return to being angled relative to the electrically conductive contact pins, which causes each of the latching pins to apply a tangential force against a respective one of the holes in the secondary device.

20. The connector component of claim 17, wherein:
after the latching pins have been inserted into the respective holes in the secondary device, the latching pins are removable from the respective holes in the secondary by moving the opposing tabs towards one another to thereby cause the latching pins to be substantially parallel to the electrically conductive contact pins.

* * * * *